United States Patent
Poucher et al.

(10) Patent No.: US 9,299,692 B2
(45) Date of Patent: Mar. 29, 2016

(54) LAYOUT OF COMPOSITE CIRCUIT ELEMENTS

(71) Applicant: ANALOG DEVICES GLOBAL, Hamilton (BM)

(72) Inventors: Frank Poucher, Raheen County Limerick (IE); Colin G. Lyden, Baltimore (IE)

(73) Assignee: Analog Devices Global, Hamilton (BM)

( * ) Notice: Subject to any disclaimer, the term of this patent is extended or adjusted under 35 U.S.C. 154(b) by 27 days.

(21) Appl. No.: 14/271,044

(22) Filed: May 6, 2014

(65) Prior Publication Data
US 2015/0228636 A1  Aug. 13, 2015

Related U.S. Application Data

(60) Provisional application No. 61/937,094, filed on Feb. 7, 2014.

(51) Int. Cl.
*H01L 25/00* (2006.01)
*H01L 27/02* (2006.01)
*H01L 23/29* (2006.01)

(52) U.S. Cl.
CPC .......... *H01L 27/0207* (2013.01); *H01L 23/293* (2013.01); *H01L 2224/32245* (2013.01); *H01L 2224/48091* (2013.01); *H01L 2224/48247* (2013.01); *H01L 2224/73265* (2013.01)

(58) Field of Classification Search
CPC ... H01L 23/293; H01L 27/0207; H01L 27/10; H01L 27/102
See application file for complete search history.

(56) References Cited

U.S. PATENT DOCUMENTS

| | | | | |
|---|---|---|---|---|
| 6,933,770 B1 * | 8/2005 | Ranucci | | 327/539 |
| 7,118,273 B1 | 10/2006 | Schnaitter | | |
| 7,772,920 B1 | 8/2010 | Anderson et al. | | |
| 8,729,636 B2 * | 5/2014 | Van Den Boom | | 257/369 |
| 9,030,000 B2 * | 5/2015 | Eu et al. | | 257/692 |
| 2007/0145534 A1 | 6/2007 | Murakami | | |

FOREIGN PATENT DOCUMENTS

EP  2 284 640  2/2011

* cited by examiner

*Primary Examiner* — Jeffrey Zweizig
(74) *Attorney, Agent, or Firm* — Knobbe, Martens, Olson & Bear, LLP (57) ABSTRACT

Physical layouts of ratioed circuit elements, such as transistors, are disclosed. Such layouts can maintain electrical characteristics of the ratioed circuit elements relative to one another in the presence of mechanical stresses applied to an integrated circuit, such as an integrated circuit encapsulated in plastic. The ratioed circuit elements can include first and second composite circuit elements formed of first and second groups of circuit elements, respectively, arranged around a center point. The first group of circuit elements can be arranged on a grid and the second group of circuit elements can include four circuit elements spaced approximately the same distance from the center point. Each of the circuit elements in the second group can be off the grid in at least one dimension. The first and second groups of circuit elements can be arranged around a perimeter of dummy circuit elements in some embodiments.

21 Claims, 3 Drawing Sheets

LAYOUT OF COMPOSITE CIRCUIT ELEMENTS

CROSS REFERENCE TO RELATED APPLICATION

This application is a non-provisional of and claims the benefit under 35 U.S.C. §119(e) of U.S. Provisional App. No. 61/937,094, filed Feb. 7, 2014, titled "LAYOUT OF COMPOSITE CIRCUIT ELEMENTS," the entire disclosure of which is hereby incorporated by reference herein.

TECHNICAL FIELD

The disclosed technology relates to electronics, and, more particularly, to physical layouts of circuit elements on an integrated circuit.

DESCRIPTION OF THE RELATED TECHNOLOGY

Integrated circuits can be encapsulated in a molding compound, such as a plastic. Significant stresses can be applied to electronic circuits of the integrated circuit by a package of the integrated circuit. Such stresses can vary due to, for example, temperature and/or humidity. Accordingly, calibration to remove errors after encapsulation may not adequately compensate for stresses that result from operating conditions of the electronic circuit. Stress applied to the electronic circuit can impact the electrical characteristics and/or performance of the electronic circuit. However, previous attempts to compensate for mechanical stresses applied by a package of an integrated circuit to the electronic circuit have not fully compensated for such stresses.

Accordingly, there is need for improving the performance of electronic circuits in the presence of stresses applied to an integrated circuit.

SUMMARY OF CERTAIN INVENTIVE ASPECTS

One aspect of this disclosure is an apparatus that includes a first group of circuit elements on an integrated circuit and a second group of circuit elements on the same integrated circuit. The first group of circuit elements is arranged on a two-dimensional grid around a center point. The first group of circuit elements is configured to function as a first composite circuit element having a first area. The second group of circuit elements is arranged around the same center point. The second group of circuit elements is configured to function as a second composite circuit element having a second area. The second group of circuit elements comprises four circuit elements spaced approximately the same distance from the center point. Each of the four circuit elements in the second group of circuit elements is off the grid in at least one dimension. A circuit on the same integrated circuit that includes the first group of circuit elements and the second group of circuit elements is configured to function based on a ratio of the first area to the second area, in which the first area is at least two times bigger than the second area Another aspect of this disclosure is an apparatus that includes an arrangement of transistors on a single integrated circuit. The arrangement of transistors includes a first group of transistors, a second group of transistors, and one or more dummy transistors. The first group of transistors is arranged around a center point and configured to function as a first composite transistor having a first area. The second group of transistors is arranged around the same center point and configured to function as a second composite transistor having a second area. The first area is at least twice the second area. The first and second groups of transistors are arranged around an entire perimeter of the one or more dummy transistors.

Yet another aspect of this disclosure is a method of forming an integrated circuit. The method includes forming a first group of transistors on an integrated circuit arranged around a center point, in which the first group of transistors is configured to function as a first composite transistor having a first area. The method also includes forming a second group of transistors on the same integrated arranged around the same center point circuit, wherein four transistors of the second group are approximately the same distance from the center point. The second group of transistors is configured to function as a second composite transistor having a second area, and the first area is at least approximately two times bigger than the second area. The method further includes forming dummy transistors in a cross pattern on the same integrated circuit. The first and second groups of transistors are formed around a perimeter of the dummy transistors, and one of the dummy transistors is disposed on the center point of the arrangement of the first and second groups of transistors.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF CERTAIN EMBODIMENTS

The following detailed description of certain embodiments presents various descriptions of specific embodiments. However, the innovations described herein can be embodied in a multitude of different ways, for example, as defined and covered by the claims. In this description, reference is made to the drawings where like reference numerals may indicate identical or functionally similar elements. It will be understood that elements illustrated in the figures are not necessarily drawn to scale.

As discussed above, an integrated circuit encapsulated in plastic can experience significant mechanical stresses. Such mechanical stresses can be due to, among other things, varying expansion of packaging materials due to moisture absorption and/or differences in a temperature coefficient of expansion of materials of a package. The mechanical stresses can vary, for example, with time, temperature, humidity, or any combination thereof. A resulting strain on a semiconductor crystal can cause changes in electrical characteristics of the semiconductor material. As such, mechanical stresses can be problematic for epitaxial semiconductor structures having semiconductor crystals. In one example, the resulting strain can cause a change in the bandgap voltage generated by a bandgap reference circuit.

Figure 1:
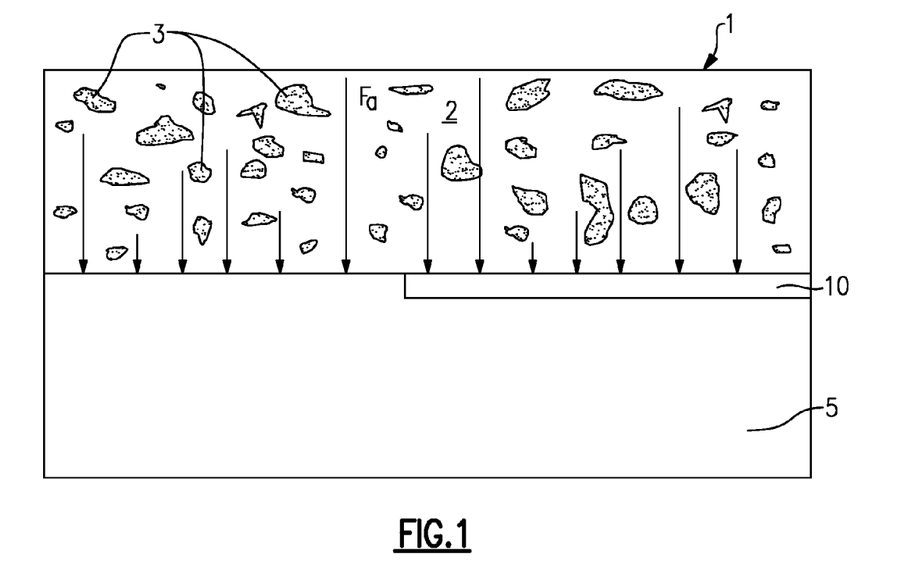
FIG. 1 is a schematic side cross-sectional view of a portion of an integrated circuit package in which a molding material applies spatially varying forces to an integrated circuit die.

FIG. 1 is a side cross-sectional view of a portion of an integrated circuit package in which a molding material 1 including plastic material 2 and filler particles 3 applies spatially varying forces to an integrated circuit (IC) 5. The IC 5 can include various types of circuits. The circuits of the IC 5 can include one or more sensitive electronic circuits, such as a bandgap reference circuit 10, which are sensitive to external forces or stresses. Although the bandgap reference circuit 10 is illustrated schematically in FIG. 1, it will be understood that the bandgap reference circuit 10 can be formed from one or more layers of the IC 5. While features of this disclosure may be described with reference to the bandgap reference circuit 10 for illustrative purposes, the principles and advantages described herein can be applied to a variety of other circuits such as proportional to absolute temperature (PTAT) circuits, voltage reference circuits, or other circuits that function based on precise ratios of circuit elements that are other than 1:1. Such circuits can be particularly sensitive to packaging stresses because they are meant to output an accurate absolute voltage for reference by other circuits.

Operating conditions of circuits of the IC 5 can vary due to time, temperature, humidity, or other operating conditions. Such variation in operating conditions can cause mechanical stresses on the IC 5. Circuits can be calibrated to remove errors after encapsulation. However, in some instances, these variations can have a significant impact after calibration. Accordingly, a need exists to compensate for mechanical strains across an integrated circuit that can occur after calibration. A mechanical model of typical integrated circuit packages in which the IC 5 is encapsulated in a plastic molding compound 1 showed that the variation of strain across the IC 5 can be accurately modeled by a second order function. Thus, it would be desirable for the layout of circuit elements to compensate for both first order and second order effects that result from mechanical strain across the IC 5 encapsulated in the plastic molding compound 1. Such a layout can compensate for mechanical stresses on the IC 5 that are present before and/or after calibration.

A number of linear components such as amplifiers and converters can be designed to be tolerant of absolute electrical changes by relying on component matching on a specified ratio, such as 1:1. Yet, in certain circuits such as the bandgap reference circuit 10, stable circuit operation can depend on maintaining precise ratios of sizes of circuit elements that are other than 1:1, such as 8:1. Matching precise ratios other than 1:1 can be challenging, especially when accounting for second order effects due to mechanical strain across the IC 5. PTAT circuits, such as voltage reference circuits, can be used to match precise ratios of circuit elements that are other than 1:1. One example of a PTAT circuit is the bandgap reference circuit 10.

As shown in FIG. 1, the molding material 1 can be disposed over the IC 5 and the bandgap reference circuit 10. The molding material 1 of FIG. 1 can include the plastic material 2 and filler particles 3 dispersed throughout the plastic material 2. The plastic material 2 can comprise an epoxy or other suitable base material. The particles 3 can comprise silica. In some applications, such particles 3 are dispersed throughout the plastic material 2 to reduce thermal mismatch between the molding compound 1 and the IC 5, which can be formed primarily of silicon or other suitable semiconductor materials. For example, in some molding compounds 1, the particles 3 can account for about 80% to about 90% of the molding compound 1, and the plastic material 2 can account for about 10% to about 20% of the molding compound 1. The particles 3 may have varying sizes, as shown schematically in FIG. 1. For example, the sizes of silica particles can range from about 1 micron to about 50 microns, and in some cases, from about 1 micron to about 100 microns. By dispersing large amounts of silica in the molding material 1, the temperature coefficient of expansion of the molding material 1 can be reduced. Adjusting the temperature coefficient of expansion can reduce the difference between thermally induced stresses near the interface between the molding compound 1 and the IC die 5 that can result at a molding temperature and an operating temperature. Reducing this difference in thermally induced stresses can improve performance of circuits on the IC 5.

However, changes in the molding compound 1 due to hygroscopic swelling and the presence of the particles 3 in the molding compound 1 can induce a spatially varying applied force $F_a$ on a top surface of the IC 5 at the interface of the IC 5 and the molding compound 1. For example, the particles 3 can have sizes that vary substantially randomly, and the particles 3 can be substantially randomly distributed throughout the molding compound 1. At various times during the life of the packaged integrated circuit, moisture content, temperature, and/or other environmental conditions of the molding compound 1 are expected to change. During manufacturing, assembly, or during use by the end user, varying amounts of moisture can be absorbed by the molding compound 1. As one example, during assembly, the humidity of the factory may be controlled, but during use by the end user, the humidity may increase if the package is integrated in an electronic system exposed to the atmosphere. As the molding compound 1 is particularly hygroscopic, absorbing moisture can cause changes in the molding compound 1. Because the positions and sizes of the particles 3 may vary substantially randomly, movement of the particles 3 due to changes in the molding compound 1 that result from hygroscopic swelling may also vary substantially randomly over a large range.

Thus, changes in the molding compound 1 due to hygroscopic swelling can induce the spatially varying force $F_a$ on the top surface of the IC 5. The induced force $F_a$ may have force components normal to the top surface of the IC 5 (as schematically illustrated in FIG. 1) and/or tangential or parallel to the top surface of the IC 5. The force $F_a$ can thus transmit an uneven stress to the top surface of the IC 5 and the bandgap reference circuit 10. As a result, the transmitted stress may induce a strain in the semiconductor substrate in the region of the bandgap reference circuit 10, which strain can modify the electrical properties of the bandgap reference circuit 10. Because the transmitted stress may vary across the dimensions of the bandgap reference circuit 10, the strain (e.g., the deformation) of the bandgap reference circuit 10 may vary within the bandgap reference circuit 10 itself. Circuits that function based on precise ratios of circuit elements and/or surface area, such as 2:1 or greater, may experience a drift in output voltage that deteriorates the overall performance of the package and/or of the larger electronic device or system. The physical layouts disclosed herein can reduce effects of stresses on bandgap reference circuits 10, reference voltage circuits, PTAT circuits, or the like. Accordingly, physical layouts of circuit elements described herein can reduce the impact of stresses imparted on the IC 5 by the molding material 1 and/or other components of the package and thereby improve performance of the IC 5.

Figure 2:
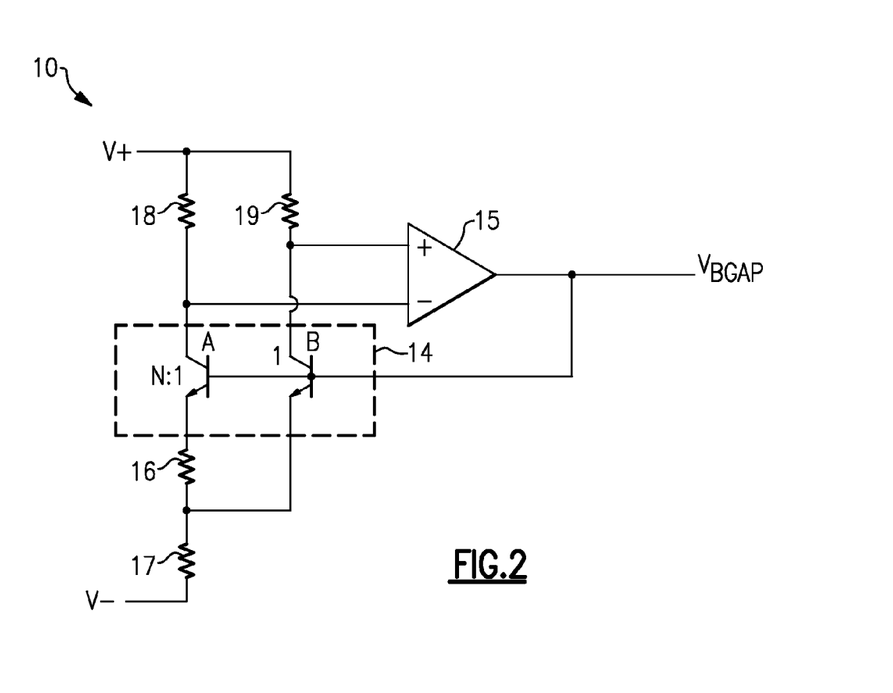
FIG. 2 is a schematic diagram of an illustrative bandgap reference circuit.

Referring to FIG. 2, an illustrative bandgap reference circuit 10 will be described. The bandgap reference circuit 10 can be a Brokaw bandgap reference circuit as illustrated. The bandgap reference circuit 10 includes an amplifier 15 configured to generate a substantially constant output voltage $V_{BGAP}$, even as a difference between positive voltage V+ and negative voltage V− changes. For instance, the negative voltage V− can be a ground potential and the positive voltage V+ and be a power supply voltage that can vary. In this example, the output voltage $V_{BGAP}$ can be substantially constant as the power supply voltage varies. A pair of ratioed transistors 14 that includes a first transistor A and a second transistor B that can generate inputs to the negative and positive input terminals, respectively, of the amplifier 15. As illustrated, the first and second transistors A and B, respectively, are bipolar transistors each having a collector, a base, and an emitter. The collector of the first transistor A can provide an input to the negative input terminal of the amplifier 15 and the collector of the second transistor B can provide an input to the positive input of the amplifier 15. The emitter of the first transistor A is electrically connected to a negative voltage V− via two resistors 16 and 17 in series. The emitter of the second transistor B is electrically connected to a node between the series resistors 16 and 17. A positive voltage V+ is electrically connected to the collector of the first transistor A via a resistor 18 and the positive voltage V+ is electrically connected to the collector of the second transistor B via a separate resistor 19.

The stability of the output voltage $V_{BGAP}$ can depend on the electrical characteristics associated with a precise ratio of the emitter area of the first transistor A to the emitter area of the second transistor B. As illustrated, the ratio of emitter areas of the first transistor A to the second transistor B can be N:1, in which N is at least approximately 2. For instance, N can be a positive integer that is two or greater. As used herein, an integer ratio encompasses ratios that vary from exact mathematical integer ratios due to process variations, such as standard variations from non-uniformities in photolithography, etching, doping, etc. According to some implementations, N is 8. In other non-limiting examples, N can be at least 4 or at least 8. Electrical characteristics of the first transistor A relative to electrical characteristics of the second transistor B may be affected, for example, by mechanical stresses resulting from uneven mechanical stresses on different portions of the emitters in the ratioed pair of transistors 14, such as described with reference to FIG. 1.

The physical transistor layout of the ratioed pair of transistors 14 can affect the accuracy of the effective ratio of emitter areas is under mechanical stresses. The first transistor A can be a first composite transistor formed from a first group of transistors. Similarly, the second transistor B can be a second composite transistor formed from a second group of transistors. Each transistor from the first group of transistors and each transistor from the second group of transistors can have substantially the same emitter area. Accordingly, there can be N times as many transistors in the first group of transistors as in the second group of transistors. The transistors in the first group can be arranged in parallel with each other so that the first composite transistor can have a first emitter area that corresponds to the sum of emitter areas of the transistors in the first group. Similarly, the second group of transistors can be arranged in parallel with each other so that the second composite transistor can have a second emitter area that corresponds to the sum of emitter areas of the transistors in the second group. When some other ratioed circuit elements, such as resistors, are composite circuit elements formed from groups of circuit elements, the circuit elements of the group can be arranged in series with each other.

Figure 3:
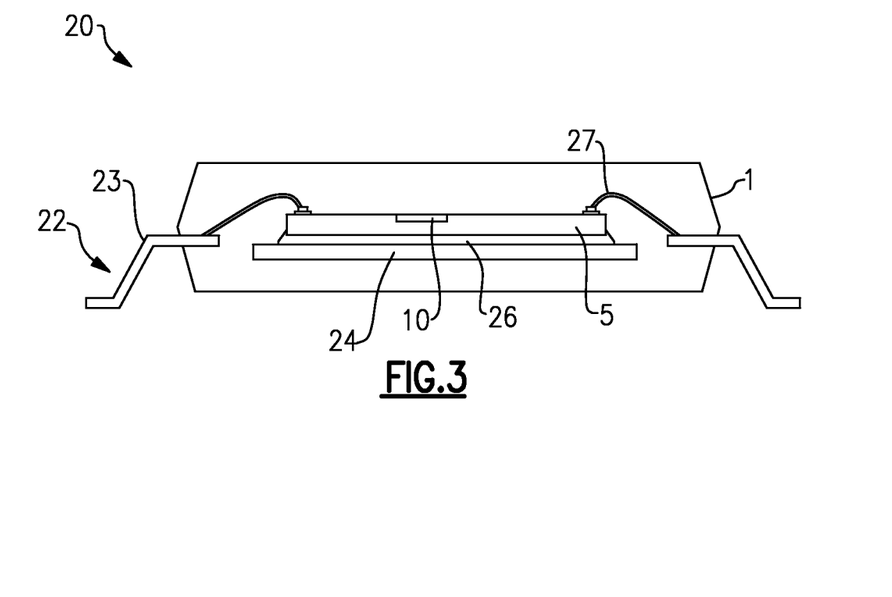
FIG. 3 is a schematic side cross-sectional view of an integrated circuit package that includes the bandgap circuit of FIG. 2.

FIG. 3 is a schematic side cross-sectional view of an integrated circuit package 20 that can include the bandgap reference circuit 10. As illustrated, the IC package 20 includes a package substrate 22 and an IC 5 mounted on the package substrate 22. Although the package substrate 22 shown in FIG. 3 is a leadframe substrate, in other arrangements a printed circuit board (PCB), a ceramic substrate or carrier, or any other suitable substrate may be used as the package substrate 22. The IC 5 can be mounted to a die paddle 24 via a die attach material 26, such as epoxy. The IC 5 can be electrically coupled to leads 23 of the package substrate 22 by wire bonds 27 or other suitable electrical connections. The molding compound 1 over the IC 5 can protect the IC 5 from an external environment. As noted above, the molding compound can include plastic with a silica filler material to enhance thermal matching between the molding compound 1 and the IC 5. However, as explained above with reference to FIG. 1, the molding compound 1 may apply spatially varying forces $F_a$ to a top surface of the IC 5 and to sensitive electronic circuits, such as the bandgap reference circuit 10. For example, in molding compounds 1 that include large amounts of silica particles, moisture can cause changes, such as hygroscopic swelling, in the molding compound 1 that can result in spatially varying stresses across the top surface of the IC 5. For some sensitive circuits, the spatially varying stresses can degrade overall performance of the package and/or the larger electronic system.

Figure 4:
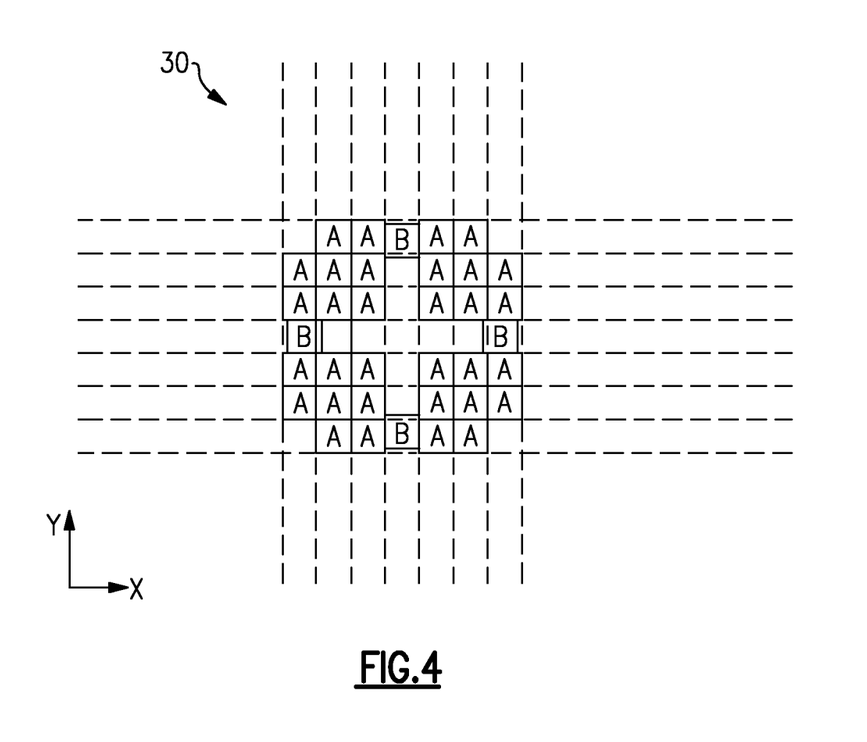
FIG. 4 is a diagram of a layout of circuit elements, according to an embodiment.
Figure 5:
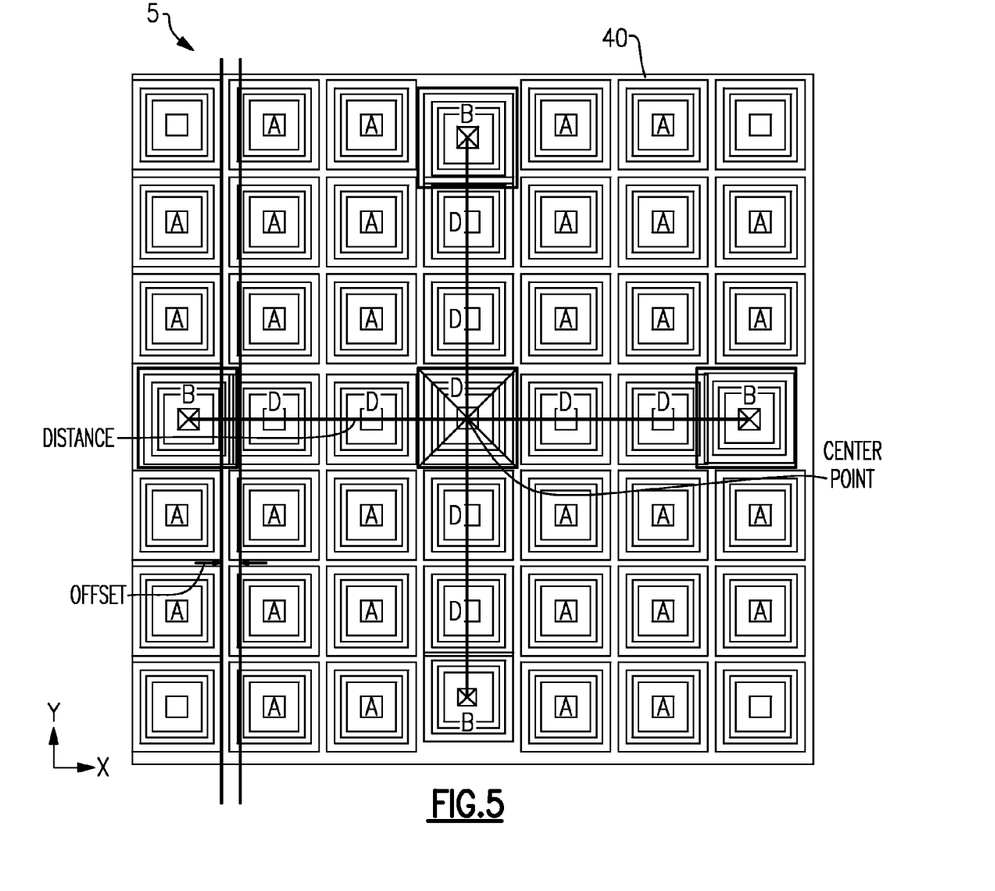
FIG. 5 is a diagram of a portion of an integrated circuit with a layout of circuit elements that includes dummy circuit elements, according to an embodiment.
Figure 6:
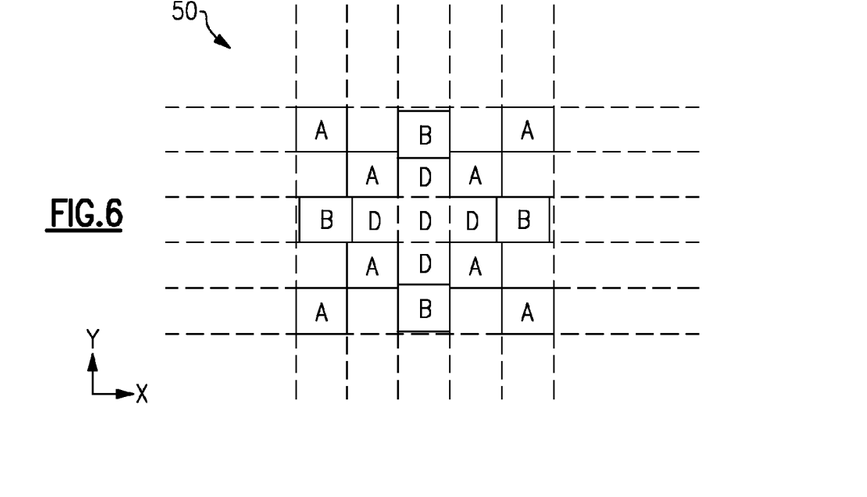
FIG. 6 is a diagram of a layout of circuit elements, according to another embodiment.

In the embodiments of FIGS. 4 to 6, composite circuit elements in a sensitive circuit, such as the bandgap reference circuit 10, are arranged in physical layouts that can compensate for both first and second order effects in mechanical models of stresses applied to IC 5. Moreover, forming such layouts can advantageously reduce and/or minimize changes in electrical behavior of the composite circuit elements in the presence of mechanical stresses applied to an integrated circuit. As one example, electrical performance of transistors of the ratioed pair of transistors 14 of FIG. 2 can be maintained relative to each other in the presence of uneven mechanical stresses on an integrated circuit with the layouts shown in FIGS. 4 and/or 5.

FIG. 4 provides an example layout 30 of circuit elements, according to an embodiment. In FIG. 4, circuit elements of the first group of circuit elements that form the first composite circuit element are labeled "A" and circuit elements of the second group of circuit elements that form the second composite circuit element are labeled "B." Each of the circuit elements of the first group and each of the circuit elements of the second group can be substantially the same size and have substantially the same area on the IC 5. It will be understood that standard variations from nonuniformity in photolithography and other semiconductor processing may result in circuit elements from the first and second groups having slightly different sizes. The layout 30 is disposed on a single integrated circuit, such as the IC 5. The single integrated circuit can include other circuit elements in some implementations. The layout 30 can be disposed on any suitable portion of the single integrated circuit. In one implementation, the layout 30 can be at the center of the single integrated circuit. The layout 30 can be the layout of the ratioed pair of transistors 14 of FIG. 2 in some embodiments. Although the layout 30 and other layouts disclose herein may be described with reference to bipolar transistors for illustrative purposes, any of the principles and advantages discussed herein can be applied to layouts of other ratioed circuit elements, such as field effect transistors, resistors, etc.

The principles and advantages described herein can be applied to a first composite circuit element having a first area that is at least two times greater than a second area of a second composite circuit element. For instance, the first area can be N times greater than the second area, in which N is a positive even integer. For instance, the circuit elements of the illustrated layout 30 have an 8:1 ratio of a first area of the group of first circuit elements A to a second area of a group of second circuit elements B. The layout 30 can compensate for both first order and second order effects resulting from a mechanical strain across an integrated circuit, such as the IC 5, that is encapsulated in plastic. In the layout 30, the circuit elements of the second composite circuit elements B are implemented as a plurality of smaller circuit elements positioned symmetrically about the center point of the layout 30 and spaced from the center point by approximately the same distance.

The illustrated layout 30 includes 32 transistors that together function as the first composite transistor A and 4 transistors that together function as the second composite transistor B. Since each of the individual transistors that form the first composite transistor A and the second composite transistor B are substantially the same size in the layout 30, the total emitter area of the first composite transistor A can be 8 times the emitter area of the second composite transistor B. The 4 transistors of the second composite transistor B can each be positioned the same distance from a center point of the layout 30. The first group of transistors that form the first composite transistor A can be arranged on a two-dimensional grid. Arranging transistors on a grid can aid in precise manufacturing of the transistors with a small feature size. However, as illustrated, the second group of transistors that form the second composite transistor B can each be off grid in at least one dimension. In FIG. 4, two transistors of the second group of transistors (B) are off grid in the x-dimension and on grid in the y-dimension in the layout 30 and two other transistors of the second group of transistors (B) are off grid in the y-dimension and on grid in the x-dimension in the layout 30. The layout 30 is symmetric about the y-axis and also symmetric about the x-axis.

FIG. 5 is a diagram of a portion of the integrated circuit 5 of FIG. 3 with a layout 40 of ratioed transistors 14 of the bandgap reference circuit 10 of FIG. 2. The layout 40 can also be implemented in a variety of other applications. The layout 40 can include any combination of features of the layout 30 of FIG. 4. In FIG. 5, transistors of the first group of transistors that form the first composite transistor A are labeled "A" and transistors of the second group of transistors that form the second composite transistor B are labeled "B." Each of the transistors of the first and second groups can have approximately the same area. The layout 40 also includes dummy transistors D. The dummy transistors D can aid in manufacturing individual transistors of the first and second groups so that they are more closely matched than if the dummy transistors D were not present. Other dummy circuit elements, such as dummy resistors, can be implemented in layouts of other ratioed circuit elements, such as composite resistors, accordance with the principles and advantages discussed herein.

Dummy circuit elements, such as dummy transistors D, can reduce imperfections in manufacturing matched circuit elements by creating similar physical environments around the matched circuit elements. Dummy circuit elements are typically non-functional. The dummy transistors D can reduce imperfections in manufacturing matched transistors in the first and second groups of transistors by creating similar physical environments around each of the transistors of the first and second groups. The dummy transistors D can be non-functional transistors. Terminals of the dummy transistors D can be shorted and/or left floating. In some embodiments, the dummy transistors D can include less than all of the layers used to form a functional transistor.

As illustrated, transistors of the first and second groups of transistors surround the entire perimeter of the dummy transistors D. The dummy transistors D can be arranged symmetrically about a center point of the layout 40. A transistor of the dummy transistors D can be over a center point of the layout 40. Accordingly, at least a portion of the dummy transistors D can be at the center of the layout 40. The dummy transistors D can be disposed in a cross pattern as shown. The cross pattern extends along the x-axis and the y-axis of FIG. 5. The majority of the dummy transistors D can be on grid. Outer dummy transistors D of the cross pattern can be sized differently from the other dummy transistors D and also sized differently from the transistors of the first and second groups. For instance, as illustrated, the outer dummy transistors D can be smaller than other transistors in the layout 40 to allow the transistors of the second group of transistors (B) to be off-grid in one dimension. In other arrangements (not illustrated), the outer dummy transistors can be larger than the other transistors of the layout 40. As illustrated, outer dummy transistors of the cross pattern abut transistors of the first group (A) on opposing sides and a transistor of the second group (B) on another side that is substantially orthogonal to the opposing sides. Some dummy transistors D can abut transistors of the first group on opposing sides and different dummy transistors on different opposing sides. A dummy transistor D over the center of the layout 40 can abut other dummy transistors D on opposing sides (adjacent on the y-axis) and different dummy transistors D on different opposing sides (adjacent on the x-axis).

The four transistors that together form the second composite transistor B are each spaced approximately the same distance from the center point of the layout 40. Accordingly, each of these four transistors that together form the second composite transistor B can be off grid by an offset in one dimension. As illustrated, two transistors of the second group of transistors are off grid by the offset in the x-dimension and two other transistors of the second group of transistors are off grid by the offset in the y-dimension. The center point can be at the centroid of the first composite transistor A and the second composite transistor B.

The distance of each of the transistors of the second group from the center point can reduce, and in some cases minimize, variations in electrical performance of the first composite transistor A relative to the variations in electrical performance of the second composite transistor B due to mechanical stresses on the IC 5. In such layouts, each of the transistors of the second group of transistors can be positioned approximately the same distance from the center point. Two transistors of the second group of transistors can be disposed along the x-axis on opposing sides of the center point and two other of transistors B of the second group of transistors can be disposed along the y-axis on opposing sides of the center point.

Mechanical stresses can cause the electrical characteristics of a bipolar transistor to behave as if the bipolar transistor had an effective emitter area that is different than the actual emitter area of the bipolar transistor. A second order mechanical model can be used to compute a ratio of the effective emitter area of the first composite transistor A to the effective emitter area of the second composite transistor B in the presence of variations due to mechanical stress. The second order mechanical model can be a quadratic equation. The second order model can account for spatially varying forces being applied to the integrated circuit, such as the forces described with reference to FIG. 1. Such spatially varying forces can exhibit statistical randomness. The second order model can account for average spatially varying forces across the IC 5. The four transistors of the second group of transistors can each be positioned to maintain the desired ratio of the effective emitter area of the first composite transistor A to the effective emitter area of the second composite transistor B in the presence of mechanical stresses applied to the IC 5, in which each of the transistors of the second group is disposed the same distance from the center point of the layout 40 of the first composite transistor A and second composite transistor B.

While FIGS. 4 and 5 relate to a layout of ratioed circuit elements with an 8:1 ratio, the principles and advantages discussed herein can be applied to ratioed circuit elements, such as ratioed transistors, with any suitable ratio of areas. As an example, the ratioed circuit elements can have any positive even integer ratio of areas. For instance, ratioed circuit elements with a ratios of, for example, 2:1, 4:1, 6:1, 8:1, etc., can be implemented in a physical layout in accordance with the principles and advantages described herein. Such ratioed circuit elements can be composite circuit elements formed of a first group of circuit elements and second group of circuit elements, in which the second group of circuit elements has fewer circuit elements than the first group of circuit elements. The second group of circuit elements can consist of 4 circuit elements in certain implementations. Accordingly, the ratio of circuit elements of the first group to circuit elements of the second group can be, for example, 8:4, 16:4, 24:4, 32:4, etc. According to some implementations, the number of circuit elements in second group of circuit elements can be a multiple of 4 in order to maintain the desired symmetry.

FIG. 6 provides an example layout 50 of ratioed circuit elements having a 2:1 ratio. The layout 50 is embodied on an integrated circuit, which can include any combination of features of the IC 5 of FIG. 3 and/or the packaged IC 20 of FIG. 3. The integrated circuit can include the layout 50 and other circuit elements. As illustrated, eight first circuit elements form a first composite circuit element A and four second circuit elements form a second composite circuit element B. All of the circuit elements in the first and second groups are substantially the same size. Each of the four second circuit elements are approximately the same distance from the center point of the layout 50. The layout 50 is symmetric about its center point. The layout 50 is symmetric about both the x-axis and the y-axis. Each circuit element of the second group is off grid in one dimension and each circuit element of the first group is on grid. Dummy circuit elements D can be disposed in a cross pattern and surrounded by the first and second groups of circuit elements. For instance, 4 dummy circuit elements D can be disposed in a cross pattern and surrounded by circuit elements of the first and second groups.

The systems, apparatus, and methods of compensating for stresses on packaged integrated circuits are described above with reference to certain embodiments. A skilled artisan will, however, appreciate that the principles and advantages of the embodiments can be used for any other systems, apparatus, or methods with a need for compensating for mechanical stresses on an integrated circuit and/or ratioed circuit elements on an integrated circuit with a ratio other than 1:1.

Such systems, apparatus, and/or methods can be implemented in various electronic devices. Examples of the electronic devices can include, but are not limited to, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, precision instruments, medical devices, wireless devices, a mobile phone (for example, a smart phone), cellular base stations, a telephone, a television, a computer monitor, a computer, a hand-held computer, a tablet computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic device can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values or distances provided herein are intended to include similar values within a measurement error.

The teachings of the inventions provided herein can be applied to other systems, not necessarily the systems described above. The elements and acts of the various embodiments described above can be combined to provide further embodiments. The act of the methods discussed herein can be performed in any order as appropriate. Moreover, the acts of the methods discussed herein can be performed serially or in parallel, as appropriate.

While certain embodiments of the inventions have been described, these embodiments have been presented by way of example only, and are not intended to limit the scope of the disclosure. Indeed, the novel methods and systems described herein may be embodied in a variety of other forms. For instance, it will be understood that the principles and advantages discussed herein can be used in any suitable integrated circuit with a need for ratioed circuit elements. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined by reference to the claims.

What is claimed is:

1. An apparatus comprising:
   a first group of circuit elements on an integrated circuit arranged around a center point, the first group of circuit elements configured to function as a first composite circuit element having a first area, the first group of circuit elements being arranged on a two-dimensional grid; and a second group of circuit elements on the same integrated circuit arranged around the same center point, the second group of circuit elements configured to function as a second composite circuit element having a second area, the second group of circuit elements comprising four circuit elements spaced approximately the same distance from the center point, and each of the four circuit elements in the second group of circuit elements being off the grid in at least one dimension;

wherein no circuit elements from the first group of circuit elements or the second group of circuit elements are disposed over the center point; and wherein a circuit on the same integrated circuit that includes the first group of circuit elements and the second group of circuit elements is configured to function based on a ratio of the first area to the second area, and wherein the first area is at least two times bigger than the second area.

2. The apparatus of claim 1, wherein the integrated circuit is encapsulated in plastic.

3. The apparatus of claim 1, wherein the circuit is at least one of a bandgap circuit or a proportional to absolute temperature circuit.

4. The apparatus of claim 1, wherein the first group of circuit elements comprises a first group of transistors, and wherein the second group of circuit elements comprises a second group of transistors.

5. The apparatus of claim 4, wherein the first and second groups of transistors each comprise bipolar transistors, wherein the first composite circuit element is a first composite bipolar transistor and the second composite circuit element is a second composite bipolar transistor, and wherein the first area corresponds to an emitter area of the first composite bipolar transistor and the second area corresponds to an emitter area of the second composite bipolar transistor.

6. The apparatus of claim 4, wherein the second group of transistors comprises:

two transistors disposed along a first axis through the center point and on opposing sides of the center point; and two transistors along a second axis through the center point and on opposing sides of the center point, wherein the first axis is substantially orthogonal to the second axis.

7. The apparatus of claim 6, further comprising dummy transistors arranged in a cross pattern along the first axis and the second axis, wherein each of the dummy transistors are closer to the center point than each transistor of the second group of transistors.

8. The apparatus of claim 1, wherein the second group of circuit elements comprises:

two circuit elements off the grid in a first dimension and on grid in a second dimension; and two circuit elements off the grid in the second dimension and on grid in the first dimension;

and wherein the first dimension is substantially orthogonal to the second dimension.

9. The apparatus of claim 1, wherein a plurality of circuit elements of the first group of circuit elements is closer to the center point than any of the circuit elements of the second group of circuit elements.

10. The apparatus of claim 1, wherein the ratio of the first area to the second area is an even integer ratio.

11. The apparatus of claim 1, further comprising a dummy circuit element disposed over the center point.

12. An apparatus comprising:

an arrangement of transistors on a single integrated circuit, the arrangement of transistors comprising:

a first group of transistors arranged around a center point and configured to function as a first composite transistor having a first area;

a second group of transistors arranged around the same center point and configured to function as a second composite transistor having a second area; and one or more dummy transistors;

wherein the first and second groups of transistors are arranged around an entire perimeter of the one or more dummy transistors, and wherein the first area is at least twice the second area.

13. The apparatus of claim 12, wherein the one or more dummy transistors comprise dummy transistors arranged in a cross pattern.

14. The apparatus of claim 13, wherein outer dummy transistors of the cross pattern abut transistors of the first group on opposing sides and a transistor of the second group on another side that is substantially orthogonal to the opposing sides.

15. The apparatus of claim 12, wherein the second group of transistors comprises four transistors spaced approximately the same distance from the center point.

16. The apparatus of claim 12, wherein the first group of transistors is arranged on a grid, and wherein each transistor of the second group is off the grid in one dimension.

17. The apparatus of claim 12, wherein each of the transistors of the first group and each of the transistors of the second group have approximately the same area.

18. The apparatus of claim 12, wherein the single integrated circuit is encapsulated in plastic.

19. The apparatus of claim 12, wherein the wherein first area is at least four times the second area.

20. The apparatus of claim 12, wherein the apparatus comprises a voltage reference circuit configured to generate a substantially constant reference voltage, and wherein the voltage reference circuit comprises the first composite transistor and the second composite transistor.

21. A method of forming an integrated circuit, the method comprising:

forming a first group of transistors on an integrated circuit arranged around a center point, the first group of transistors configured to function as a first composite transistor having a first area;

forming a second group of transistors on the same integrated circuit arranged around the same center point circuit, wherein four transistors of the second group are approximately the same distance from the center point, the second group of transistors configured to function as a second composite transistor having a second area, wherein the first area is at least approximately two times bigger than the second area; and forming dummy transistors in a cross pattern on the same integrated circuit, wherein the first and second groups of transistors are formed around a perimeter of the dummy transistors, and wherein one of the dummy transistors is disposed on the center point of the arrangement of the first and second groups of transistors.

* * * * *

UNITED STATES PATENT AND TRADEMARK OFFICE
CERTIFICATE OF CORRECTION

PATENT NO. : 9,299,692 B2  
APPLICATION NO. : 14/271044  
DATED : March 29, 2016  
INVENTOR(S) : Frank Poucher et al.

Page 1 of 1

It is certified that error appears in the above-identified patent and that said Letters Patent is hereby corrected as shown below:

Specification

In column 1 at line 59, after "area" insert --.--.

Claims

In column 12 at line 34 (approx.), in Claim 19, after "wherein the" delete "wherein".

Signed and Sealed this  
Nineteenth Day of July, 2016

Michelle K. Lee  
*Director of the United States Patent and Trademark Office*